United States Patent
Kimura et al.

(10) Patent No.: US 7,421,781 B2
(45) Date of Patent: Sep. 9, 2008

(54) METHOD OF FORMING A MODULE COMPONENT HAVING A PLURALITY OF PENETRATION HOLES

(75) Inventors: Suzushi Kimura, Osaka (JP); Tsuyoshi Himori, Osaka (JP); Koji Hashimoto, Hyogo (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 317 days.

(21) Appl. No.: 10/788,463

(22) Filed: Mar. 1, 2004

(65) Prior Publication Data

US 2004/0165361 A1    Aug. 26, 2004

Related U.S. Application Data

(62) Division of application No. 10/212,698, filed on Aug. 7, 2002, now Pat. No. 6,879,493, which is a division of application No. 09/719,631, filed as application No. PCT/JP00/02333 on Apr. 11, 2000, now Pat. No. 6,806,428.

(30) Foreign Application Priority Data

Apr. 16, 1999   (JP)   ................... 11-109352
Jun. 15, 1999   (JP)   ................... 11-167903

(51) Int. Cl.
   *H05K 3/30*   (2006.01)
(52) U.S. Cl. .............. 29/841; 29/846; 29/848; 174/521; 174/527; 257/678; 438/106; 438/127
(58) Field of Classification Search .................. 29/830, 29/831, 832, 841, 846, 848, 854, 855; 257/678; 438/100, 106, 108, 109, 113, 127; 174/524, 174/521, 527
See application file for complete search history.

(56) References Cited

U.S. PATENT DOCUMENTS 3,134,930 A   5/1964   Wright (Continued)

FOREIGN PATENT DOCUMENTS

EP   0 574 206 A2   12/1993

(Continued)

OTHER PUBLICATIONS

European Search Report issued in corresponding European Patent Application No. EP 00915469.1-1235, dated Jul. 16, 2007.

*Primary Examiner*—Rick K Chang
(74) *Attorney, Agent, or Firm*—McDermott Will & Emery LLP

(57) ABSTRACT

According to the invention, the method of manufacturing a module component comprises an inserting step of inserting a chip component in a first molding die; a primary molding step of filling the first molding die with resin with a first end electrode of the chip component exposed; a peeling step of peeling the first molding die at a side of inserting the chip component; a secondary molding step of filling a second molding die with resin with a second end electrode of the chip component; and a forming step of forming a circuit wiring on one side or both sides of a molded element molded with resin, wherein the chip component is disposed according to a specified rule, and the chip component is molded with the resin.

4 Claims, 12 Drawing Sheets

U.S. PATENT DOCUMENTS

| | | | |
|---|---|---|---|
| 3,142,783 A | 7/1964 | Warren | |
| 3,266,125 A | 8/1966 | Tobolski | |
| 3,290,756 A | 12/1966 | Dreyer | |
| 3,480,836 A | 11/1969 | Aronstein | |
| 4,440,972 A | 4/1984 | Taylor | |
| 4,768,286 A * | 9/1988 | Ketcham | 29/841 |
| 4,979,076 A | 12/1990 | DiBugnara | |
| 5,034,260 A | 7/1991 | Kumagai et al. | |
| 5,185,690 A | 2/1993 | Miller | |
| 5,248,852 A | 9/1993 | Kumagai | |
| 5,259,110 A * | 11/1993 | Bross et al. | 29/830 |
| 5,280,192 A * | 1/1994 | Kryzaniwsky | 257/723 |
| 5,309,324 A | 5/1994 | Herandez et al. | |
| 5,497,033 A * | 3/1996 | Fillion et al. | 257/723 |
| 5,820,983 A * | 10/1998 | Curtin | 425/388 |
| 5,874,770 A | 2/1999 | Saia et al. | |
| 6,180,881 B1 | 1/2001 | Isaak | |
| 6,228,676 B1 * | 5/2001 | Glenn et al. | 438/107 |

FOREIGN PATENT DOCUMENTS

| | | |
|---|---|---|
| GB | 1 249 108 | 10/1971 |
| JP | 56-125891 | 10/1981 |
| JP | 56-174833 | 12/1981 |
| JP | 59-30549 | 8/1984 |
| JP | 63-169798 | 7/1988 |
| JP | 4-32780 | 8/1992 |
| JP | 8-228066 | 9/1996 |

* cited by examiner

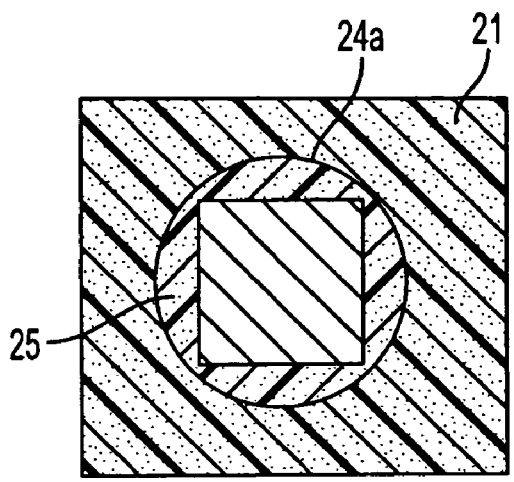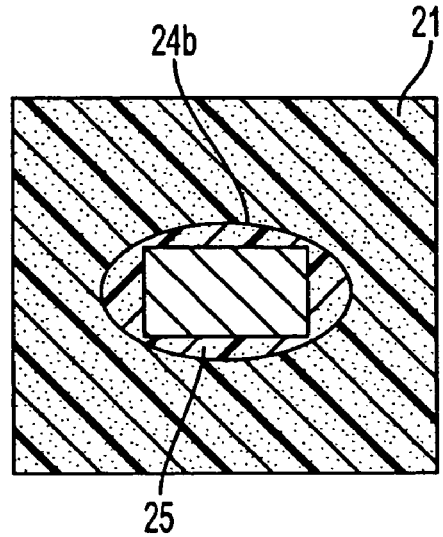
FIG. 4(a)    FIG. 4(b)
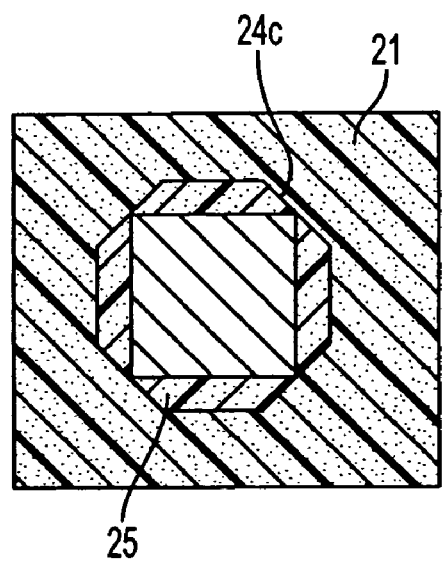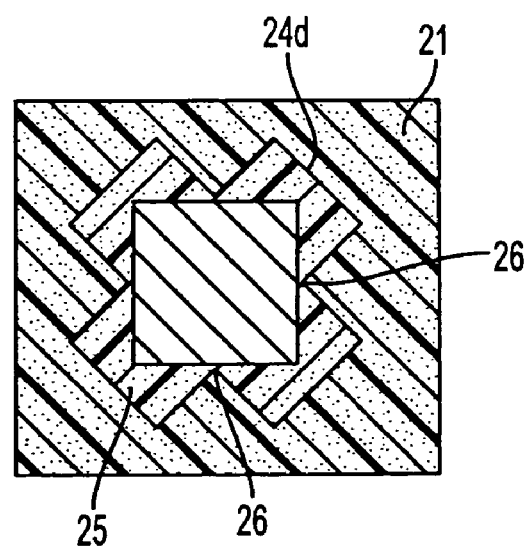
FIG. 4(c)    FIG. 4(d)

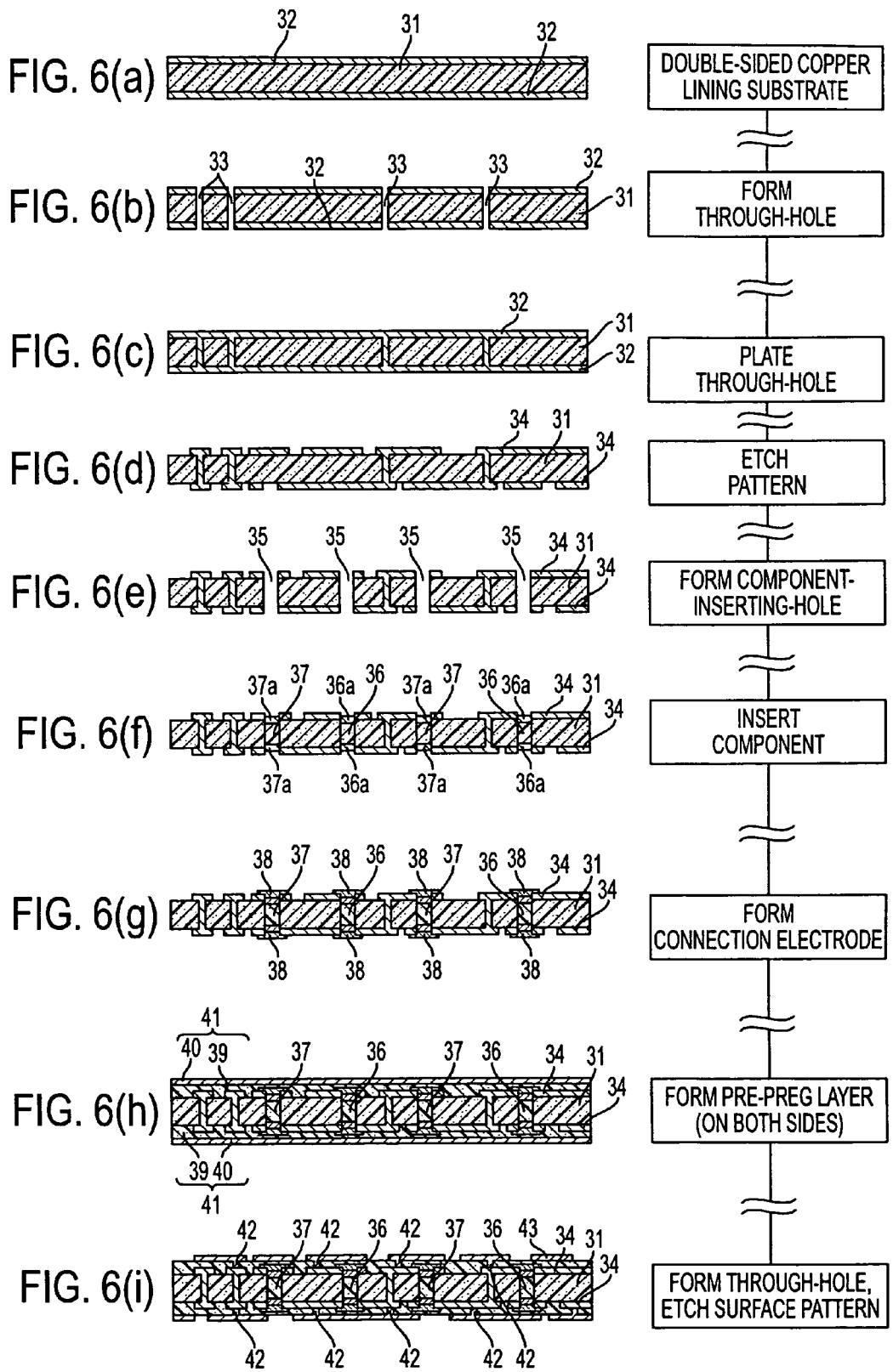

METHOD OF FORMING A MODULE COMPONENT HAVING A PLURALITY OF PENETRATION HOLES

This application is a divisional of application Ser. No. 10/212,698 filed Aug. 7, 2002, now U.S. Pat. No. 6,879,493 which is a divisional of application Ser. No. 09/719,631, filed Feb. 12, 2001, now U.S. Pat. No. 6,806,428 which is a 371 of PCT/JP00/02333, filed Apr. 11, 2000.

TECHNICAL FIELD

The present invention relates to a module component composed by mounting a chip component in a circuit board or by molding a chip component, and a method of manufacturing the same.

BACKGROUND ART

Recently, there is a rapid trend for smaller size, lighter weight, thinner structure, and multiple functions for electronic appliances, and various technologies for mounting circuit elements at high density are proposed. One of them is a technology for embedding electronic components in a substrate.

As this type of substrate embedding electronic components, for example, Japanese Laid-open Patent No. 63-169798 is known, and the structure as shown in FIG. 12(a) realizes an equivalent circuit as shown in FIG. 12(b).

In the diagram, reference numeral 102 denotes a multi-layer substrate laminating ceramic substrates 121 through 126 in multiple layers. Capacitors 103, 104 and resistor 105 are inserted in penetration holes 107 formed in multi-layer substrate 102, and they are electrically connected by conductors 106.

In the prior art, however, capacitors 103, 104 and resistor 105 must be finally baked together with multi-layer substrate 102, and special components excellent in heat resistance are needed. But it is hard to obtain sufficient heat resisting effect as the size of the electronic components becomes smaller. Specified values may not be obtained due to characteristic deterioration or characteristic fluctuation by heat treatment at high temperature, and therefore, desired circuit characteristics and functions are not obtainable. The dimensions vary due to shrinkage and contraction by heat treatment at high temperature, and it is accordingly hard to obtain components of precise dimensions, and size reduction is limited.

SUMMARY OF THE INVENTION

The invention is devised to solve the conventional problems, and it is hence an object thereof to present a module component capable of: obtaining desired circuit characteristics and functions stably; easily applied to automatic insertion and high speed chip components to be buried, and producing very efficiently; and a method of manufacturing the same, even if the size of the electronic component is reduced.

To achieve the object, the invention is characterized by disposing penetration holes formed in a circuit board made of a resin material according to a specified rule and accommodating a specific number of chip components to compose a desired circuit, or arranging a specific number of chip components according to a specified rule and molding a resin so as to expose the end electrode of each component to compose a desired circuit. And it is therefore not necessary to heat the buried chip components at high temperature when forming a module. Consequently, chip components are obtained in specified values, and the circuit characteristics, functions, and dimensional precision are stably obtained exactly as designed. Since the chip components are disposed according to a specified rule, it is easy to automate inserting chip components and increase its operation speed even if the size of the chip components is reduced And the circuit composition can be flexibly and easily changed by just changing inserting positions and type of chip components.

BRIEF DESCRIPTION OF THE DRAWINGS

FIG. 4 is a top view showing examples of hole shape of penetration hole in the embodiment.

FIG. 6 is a sectional view showing a manufacturing method of the module component in the embodiment.

BEST MODE FOR CARRYING OUT THE INVENTION

Embodiment 1

Figure 1A:
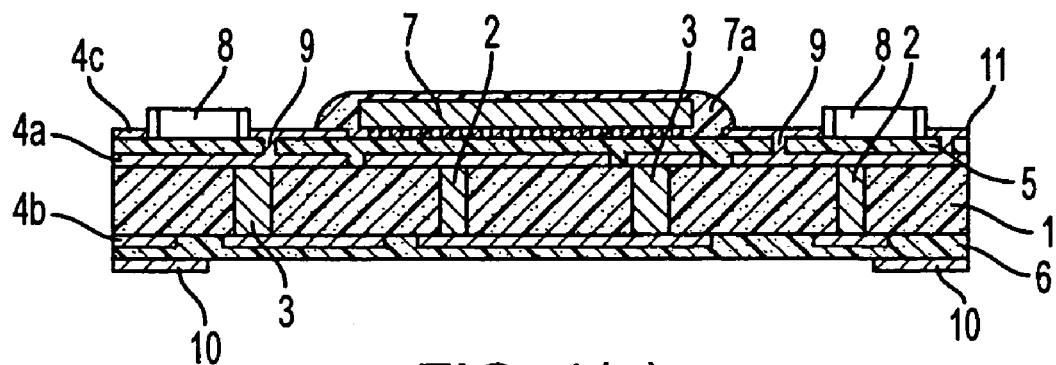
FIG. 1(a) is a sectional view showing a schematic structure of a module component in embodiment 1 of the invention.
Figure 1B:
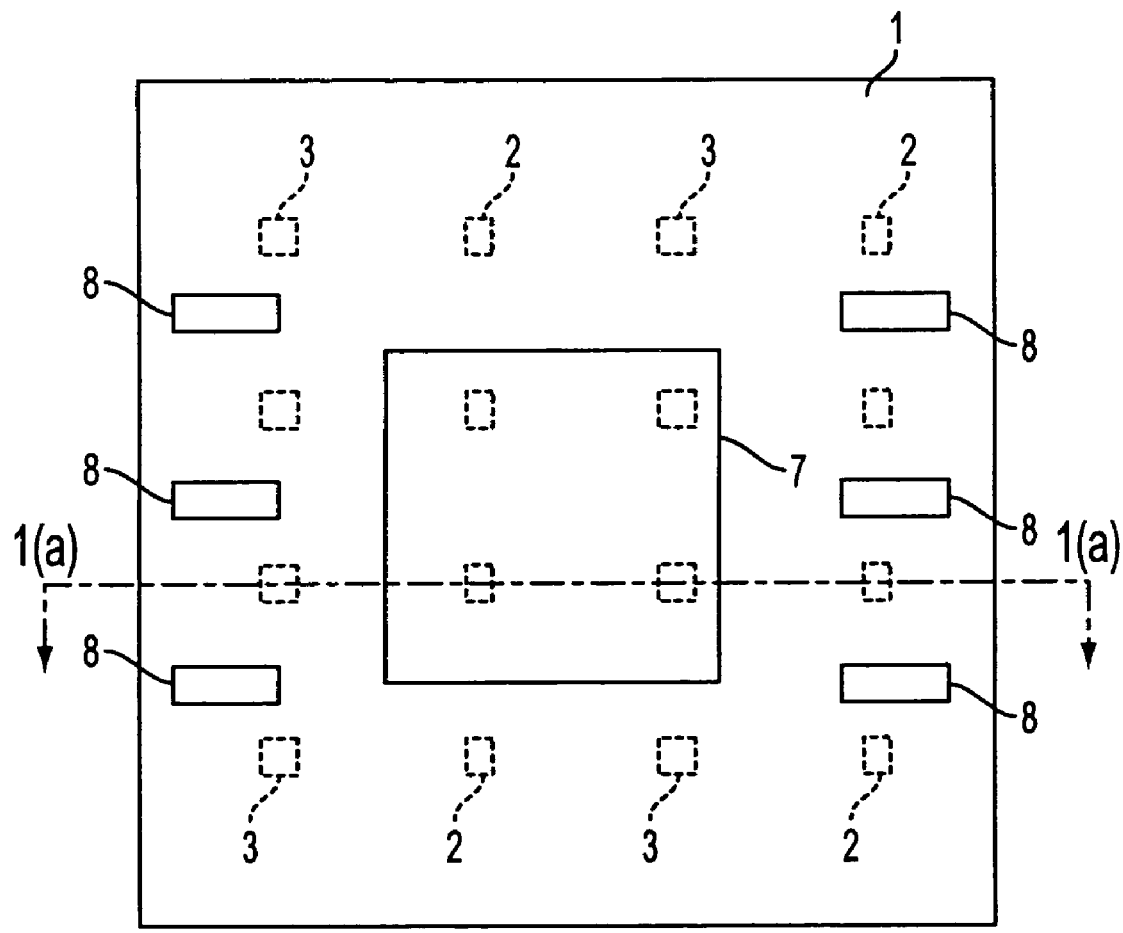
FIG. 1(b) is a top view of the component.

FIG. 1(a) is a sectional view at line I-I' showing a schematic structure of a module component in embodiment 1 of the invention, and FIG. 1(b) is a top view of the component. In the diagrams, reference numeral 1 denotes a resin substrate. In the substrate, chip resistors 2, chip capacitors 3, and other chip components are inserted into penetration holes having the nearly same hole shapes as chip components, and their end electrodes and circuit wirings 4a and 4b formed on both sides of resin substrate 1 are electrically coupled to compose a desired electric circuit. They are held and reinforced between first auxiliary substrate 5 and second auxiliary substrate 6. IC chip 7 and electronic components 8 that are hardly reduced in size are mounted on first auxiliary substrate 5 and are electrically coupled to wiring circuit 4c and further to circuit wiring 4a through conductor filling in through-holes 9. Reference numeral 7a denotes a molding resin, 10 denotes an external electrode terminal on module component 11.

The sizes of the chip components to be inserted all conforms to 0603 (0.6 mm×0.3 mm) of JIS (C-5201-8), and the height of resin substrate 1 is 0.6 mm to conform to this standard. Since the sizes of chip components are standardized, even if the circuit composition is changed, resin substrate 1 may be used commonly without changing its height, so that its versatility is very high. Herein, chip components to be inserted are resistors (R) and capacitors (C), but not limited to them. Coils (L), LC, CR and other composite components can be employed, and the same effects are obtained as far as the standardized chip components are employed.

Figure 2:
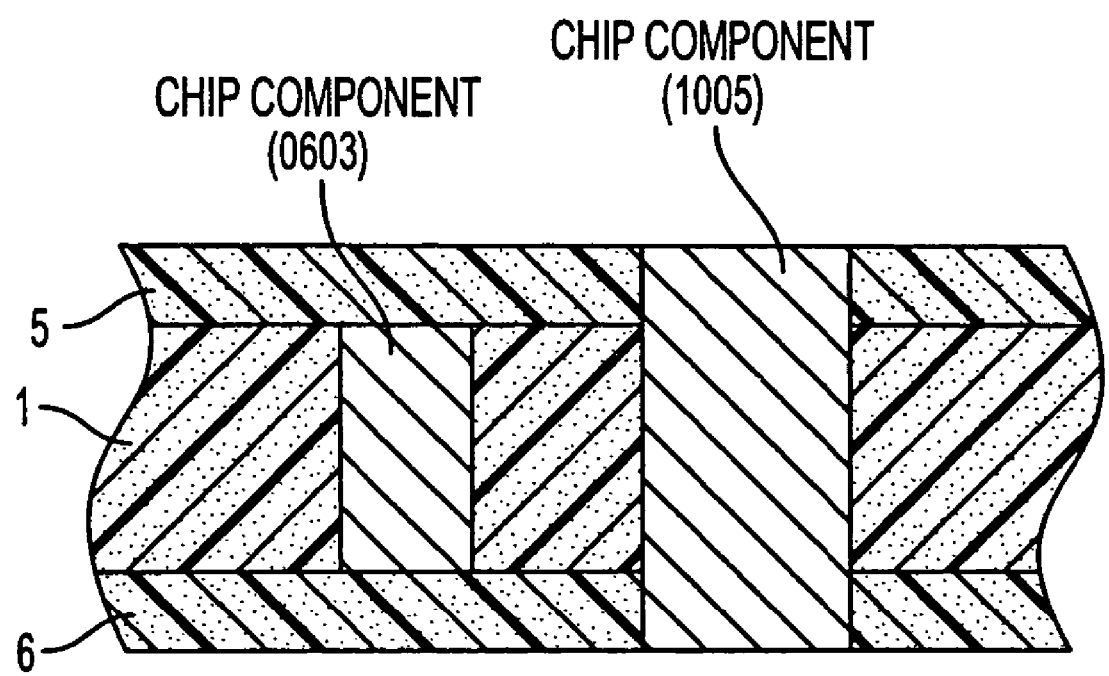
FIG. 2 is a sectional view showing other example of resin substrate in the embodiment.

Further, as shown in FIG. 2, by defining the total height of first auxiliary substrate 5, resin substrate 1, and second resin substrate 6 to 1.0 mm and penetrating therethrough, chip components of size of 1005 of JIS can be also employed. Chip components with various heights can be also employed, a circuit can be flexibly designed, and module components with a small size, multiple functions, and higher performance can thus be realized.

Figure 3A:
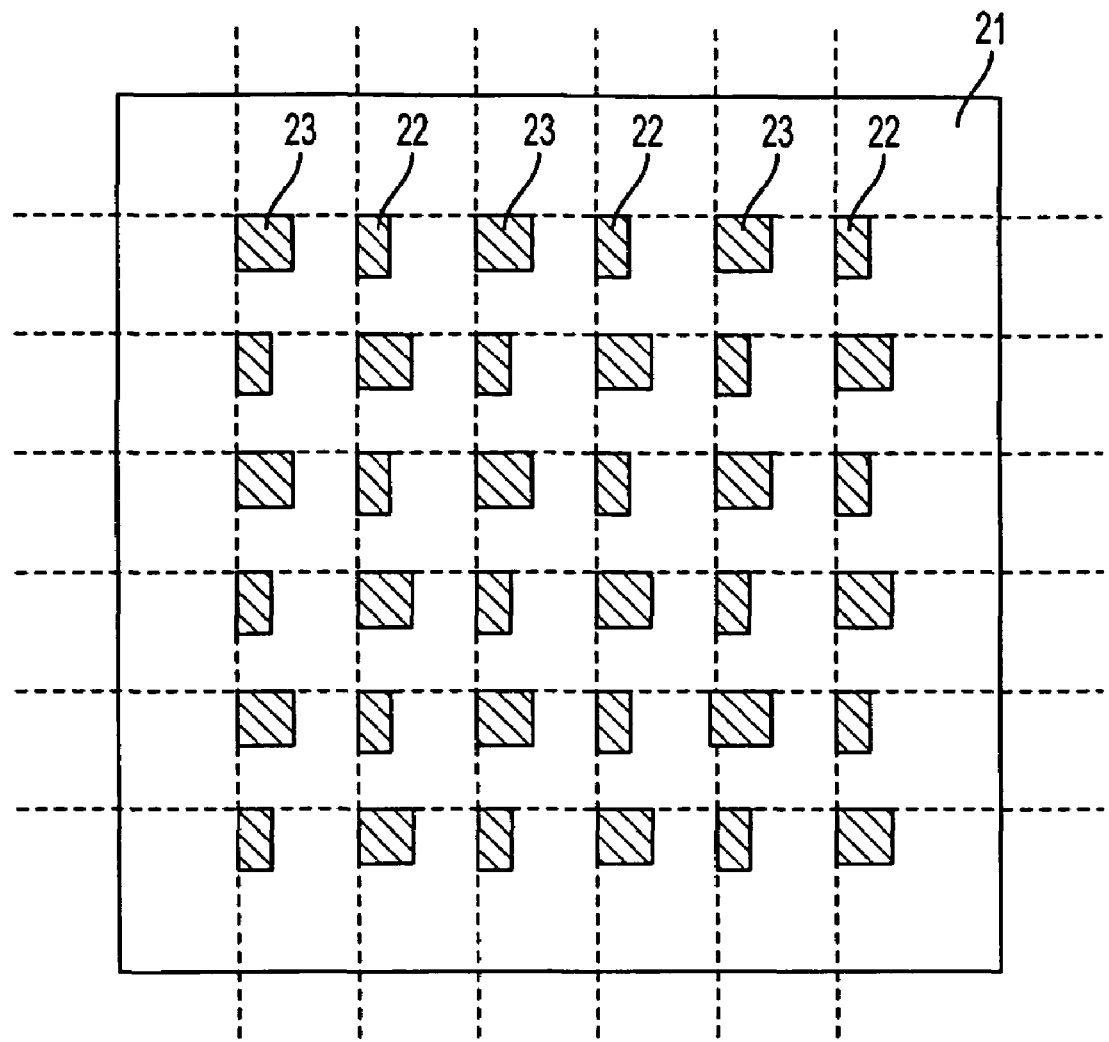
FIG. 3(a) is a schematic top view of state of chip components inserted and arranged in penetration holes provided in the resin substrate in the embodiment.
Figure 3B:
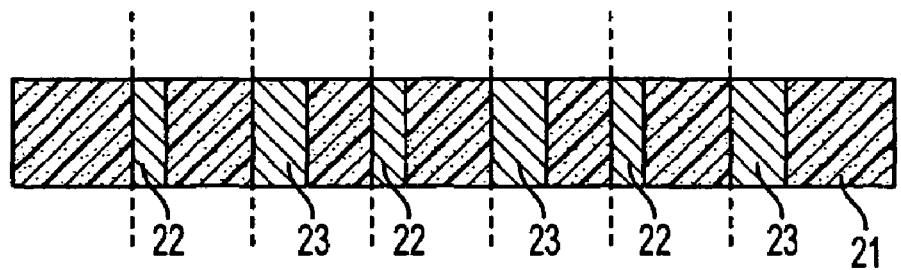
FIG. 3(b) is sectional view of the substrate.

FIG. 3 is a schematic diagram showing the state of chip components inserted in the penetration holes provided in the resin substrate, in which FIG. 3(*a*) is a top view and FIG. 3(*b*) is a sectional view.

In the diagrams, penetration holes (no reference numeral) having almost the same hole shapes as chip components are formed according to a matrix in resin substrate 21, and chip resistors 22 and chip capacitors 23 are inserted therein. In the diagram, the penetration holes are arranged so that the chip components may be inserted and arranged while two sides of each chip component is aligned. But the penetration holes can be formed so that the centers of the chip components may be aligned, and the same effect is thus obtained.

Herein, since the penetration holes are formed regularly and precisely according to a matrix, it is very easy to insert chip components by machine. And as a result of enhancing a performance of an automatic inserting machine, the chip components may be further reduced in size, and the pitch of penetration holes may be narrowed.

The penetration holes are schematically disposed on the entire surface of resin substrate 21, and chip resistors 22 and chip capacitors 23 are inserted alternately, but the technique is not limited to this configuration. A desired circuit can be composed by: forming penetration holes according to the size of chip components to be inserted only in necessary positions depending on the circuit design and inserting a specific number of chip components. A desired circuit may be also composed by forming penetration holes in the entire matrix surface and inserting a specific number of chip components only in necessary positions depending on the circuit design with filling the remaining penetration holes with insulator or inserting insulators having a chip component size, i.e., dummy components. In the latter case, in particular, the resin substrate can be used commonly, and the circuit may be composed flexibly and easily changed only by changing the inserting positions and type of the chip components. And further, by employing the dummy components, they can be inserted automatically same as other chip components, and the production efficiency is thus notably enhanced.

The hole shape of the penetration holes is not limited to the same shape as the chip components, but may be formed in circular, elliptical or polygonal shape denoted by reference numerals 24*a* through 24*d* in FIG. 4, as far as the shape is easy to hold positioning within the penetration hole. And by forming the holes in such shape, it is possible to insert chip components securely into the penetration hole even if the insertion angle of the chip component is deviated when inserting by machine for automation. By filling the gap between penetration hole and chip component with fixing member 24 made of thermosetting resin like epoxy resin, or by forming support part 26 for supporting the chip component by projecting a part of the penetration hole, the chip component can be securely supported and fixed in the penetration hole. And the reliability of connection of the circuit wiring and chip components disposed on the circuit board may be further enhanced.

Figure 5A:
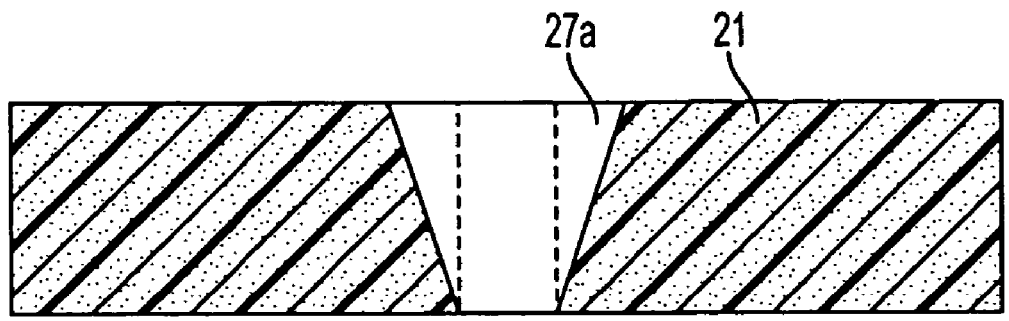
FIG. 5 is a sectional view showing examples of shapes of the penetration hole in the embodiment.
Figure 5B:
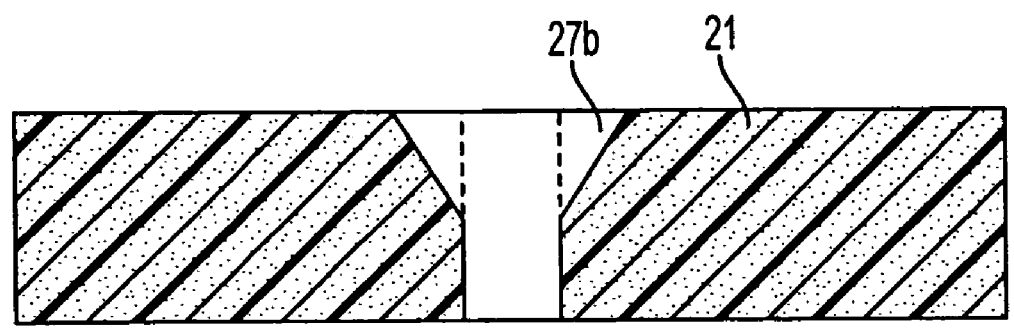
Figure 5C:
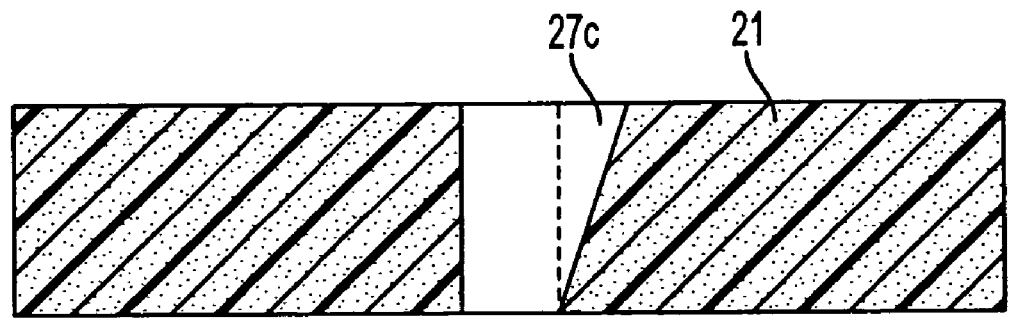

The shape of the penetration hole is not limited to a circular column, but may be tapered in such conical shape or Y-form shape as denoted by reference numerals 27*a* through 27*c* in FIG. 5. And by tapering in such shape that the end of the chip component may reach to the bottom of the penetration hole, the opening at the chip-component-inserting-side of the penetration hole becomes wider, it is easier to insert chip components by machine, a position of the chip component can be automatically determined in the penetration hole, and the gap of the penetration hole and chip component may be smoothly filled up with fixing members. Outstanding merits can thus be obtained.

Further, when an end of the chip component and a surface of the resin substrate are formed in different colors, it is easier to inspect a visual appearance, e.g. dropout of chip components, after inserting chip components into penetration holes.

A manufacturing process of the embodiment will be explained by referring to FIG. 6. Resin substrate 31 of glass epoxy or Teflon of which both sides are lined with copper foil 32 (a: double-side-copper-lined substrate) is prepared. Through-holes 33 are formed by drill or laser to penetrate through both copper foils 32 (b: through-hole forming step), and non-electric copper plating is applied to conduct between both copper foils 32 (c: through-hole plating step).

With a photolithographic technology, desired circuit wiring patterns 34 are formed on both sides of resin substrate 31 (d: pattern etching step), penetration holes 35 are formed for inserting chip components in specified positions according to a matrix (e: parts-inserting-hole forming step), and a specific number of such chip components as chip resistors 36 and chip capacitors 37 are inserted into specified penetration holes 35 (f: parts-inserting step).

Then, for coupling between end electrodes 36*a* and 37*a* of such chip components as chip resistors 36 and chip capacitors 37, circuit wiring pattern 34, conductive resin, e.g. conductive adhesive material, resin electrode material, are applied or printed on end electrodes 36*a* and 37*a*. And connection electrodes are formed (g: connection-electrode forming step). And they are held by viscous and adhesive pre-preg layer 41, which is formed with copper foil 40 on one side of auxiliary substrate 39 made of thermosetting resin like epoxy resin or phenol resin by heated and compressed in the condition of 180° C., 1 hour, and 30 kg/cm$^2$ (h: pre-preg layer forming step).

Herein, resin substrate 31 is lower than chip components, and the total of resin substrate 31 including both copper foils 32 is higher than the chip components. The configuration is for reinforcing the connection of circuit wiring pattern 34 and end electrodes 36*a*, 37*a* of chip components. But configuration is not limited to above. Resin substrate 31 can be almost as high as the chip component, i.e., resin substrate 31 can be slightly higher than the chip component, or the total including both copper foils 32 can be slightly lower than the chip component.

Then, through-holes 42 are formed and filling with conductive material, and surface circuit wiring pattern 43 is formed by photolithography (i: surface layer pattern etching step). And an IC chip and other electronic components which is hardly reduced in size are mounted on the surface as shown in FIG. 1, so that a module component having a desired circuit composition is completed (the process of mounting is not shown).

Herein, first and second auxiliary substrates 4, 5 are made of resin mainly composed of such thermosetting resin as epoxy resin or phenol resin Thanks to a process at temperature as low as possible, an influence of heat treatment on chip components decreases. And without employing special chip components having excellent heat resistance, chip components can work in the specified resistance value and capacity, so that the circuit characteristics, functions and dimensional precision exactly as designed may be obtained.

Embodiment 2

Figure 7:
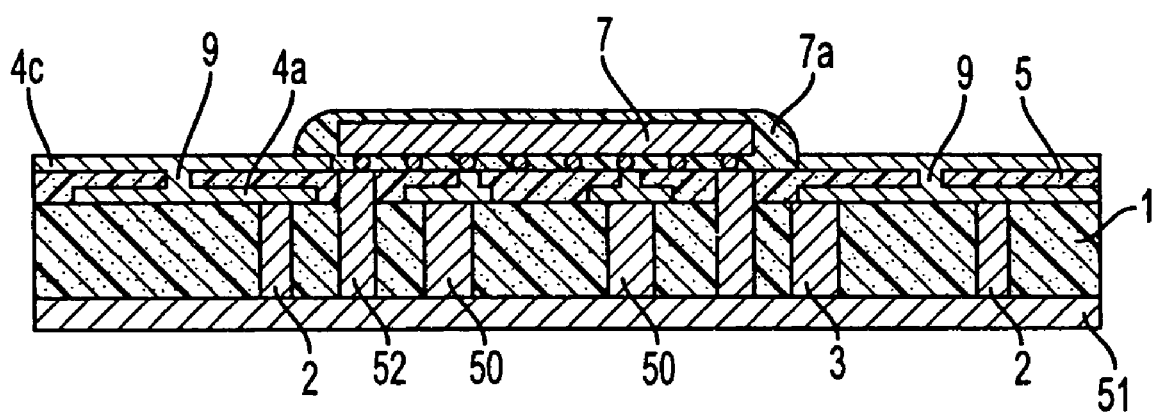
FIG. 7 is a sectional view showing a schematic structure of a module component in embodiment 2 of the invention.

FIG. 7 is a sectional view showing a schematic structure of a module component in embodiment 2 of the invention, in which same elements as in embodiment 1 in FIG. 1 are identified with the same reference numerals, and their explanation is omitted.

In the diagram, reference numeral 50 denotes a bypass capacitor, which is disposed immediately beneath the terminal of IC chip 7 and coupled through a shortest path. It is effective for reducing influence of noise in the wiring circuit which is often a problem in the conventional IC chip. Reference numeral 51 denotes a ground layer made of metal plate or copper foil, and the layer functions as a ground and cooling plate. And further, bypass line 52 which is made of conductive material like copper or aluminum having excellent heat conductivity immediately beneath the terminal of IC chip 7 releases heat from the IC chip therethrough efficiently. Herein, ground layer 51 is directly formed on resin substrate 1, but even when it is formed on second auxiliary substrate 6 shown in FIG. 1 to compose so as to be coupled through circuit wiring 4b and through-holes (not shown), the same effects are obtained. Moreover, when bypass line 52 is formed of such a conductive material as a copper chip having a chip component size, it can be inserted automatically in the same manner as other chip components. And working efficiency is substantially enhanced as compared with the operation of filing with conductive material.

Embodiment 3

Figure 8:
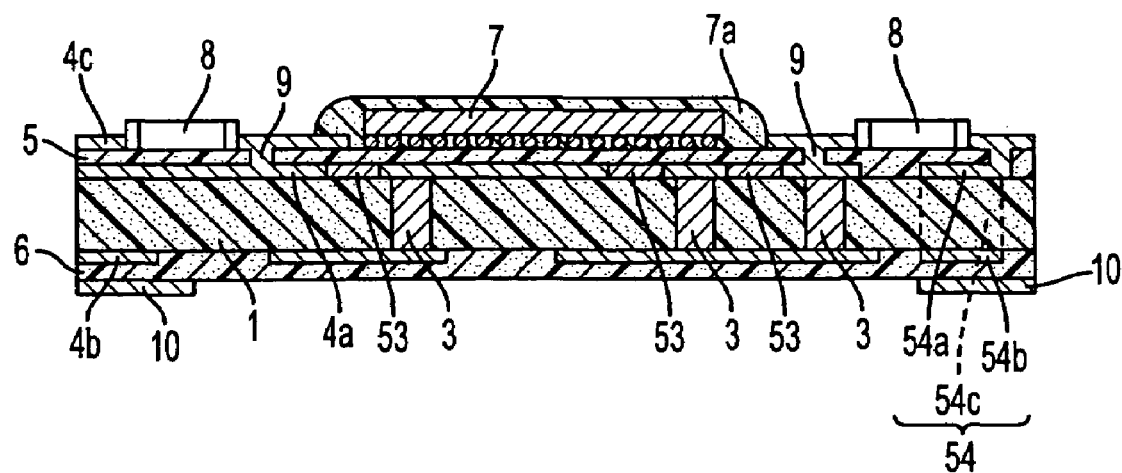
FIG. 8 is a sectional view showing a schematic structure of a module component in embodiment 3 of the invention.

FIG. 8 is a sectional view showing a schematic structure of a module component in embodiment 3 of the invention, in which same elements as in embodiment 1 in FIG. 1 are identified with same reference numerals, and their explanation is omitted.

In the diagram, reference numeral 53 denotes a printed-resistor formed on resin substrate 1. The resister can be formed on circuit wiring 4a without inserting a chip component in a penetration hole. After trimming it, first and second auxiliary substrates 5, 6 can be laminated, which is very beneficial for reducing size and producing it efficiently. Reference numeral 54 denotes a laminated-capacitor. A capacitor having a low capacitance can be formed with electrode terminals 54a, 54b in circuit wirings 4a, 4b and dielectric constant of the substrate itself 54c, so that it can be very effective for reducing the size.

As it is clear from the above description, in the foregoing embodiments 1 through 3, the penetration holes formed in the circuit board made of resin are disposed according to a specified rule, and a desired circuit is formed with putting a specific number of chip components therein A module component can be formed without baking the chip components in/on the resin substrate, and the chip components work in specified values, and the circuit characteristics, functions and dimensional precision exactly as designed may thus be obtained stably.

Since the penetration holes are disposed according to a specified rule, chip components can easily inserted into penetration holes automatically at high speed. And the technique is flexibly applicable even for a chip component having a small size, and moreover the circuit can be composed flexibly and changed easily only by changing an inserting position and a type of the chip component, and outstanding effects are obtained.

Embodiment 4

Another manufacturing method of a module component of the invention will be explained below. The structure of the module component manufactured in the manufacturing method of the embodiment is substantially same as that of embodiment 1, i.e., shown in FIG. 1, and its description is omitted.

The size of chip components to be molded in this embodiment all conforms to, same as in embodiment 1, 0603 (0.6 mm×0.3 mm) of JIS (C-5201-8), and the height of resin substrate 1 is 0.6 mm to conform to this standard. Thus, since the size of the chip component is standardized same as in embodiment 1, even if the circuit composition is changed, the height of resin substrate 1 is unchanged, and the versatility is very high.

However, unlike embodiment 1, even if the size is not standardized, the same effects are obtained in the embodiment as far as the height of the chip component is aligned. In particular when the end electrodes of standardized chip components are formed in the lateral direction, instead of the longitudinal direction, the height of resin substrate 1 can be suppressed. And a thin type module component may thus be realized by a relatively simple change only of the formed positions of the end electrodes.

Referring to FIG. 3, the resin substrate formed by the manufacturing method of the embodiment will be explained.

In the diagram, resin substrate 21 is formed where chip resistors 22 and chip capacitors 23 are molded according to a matrix, and the end electrodes are exposed. The chip components are arranged and molded so that the two sides of each chip component may be aligned in the diagram, but the same effect is obtained even if chip components are arranged and molded so that the center of each chip component may be aligned. The chip components are molded according to a matrix in the diagram, but it is not limited to this, except for disorderly scattering, same effect is obtained if the components are arranged in such a regular manner as concentric, radial or spiral profile.

Since the chip components are inserted and arranged regularly and precisely according to a matrix in a molding die, a chip component is inserted automatically at high speed by a machine easily. As the performance of the automatic-inserting-machine is enhanced, the machine is applicable to downsizing of chip components and to narrowing of a pitch of chip components.

Chip components are schematically molded in the entire surface of resin substrate 21, and chip resistors 22 and chip capacitors 23 are molded alternately, but it is not limited to the configuration. Recesses are formed only at specified position in the molding die depending on the circuit design, and chip components of specific values are inserted and arranged, so that a desired circuit may be composed. Recesses are formed according to a matrix in a molding die, and chip components of specific values can be inserted, arranged, and molded only in necessary positions depending on the circuit design. Or a desired circuit may be formed also by inserting dummy components of same height, which components hardly influence to characteristics as module components, in the remaining recesses which are not filled with chip components.

In particular, when matrix recesses formed in the molding die, the die can be used commonly, and the circuit can be changed flexibly and easily only by changing an inserting position and a type of a chip component. And further, by using the dummy components, chip components can always be molded in the same state, i.e., in the arranged state of chip components although there is a difference in the kind of components in recesses of matrix. And it can thus be molded precisely and stably.

Figure 9:
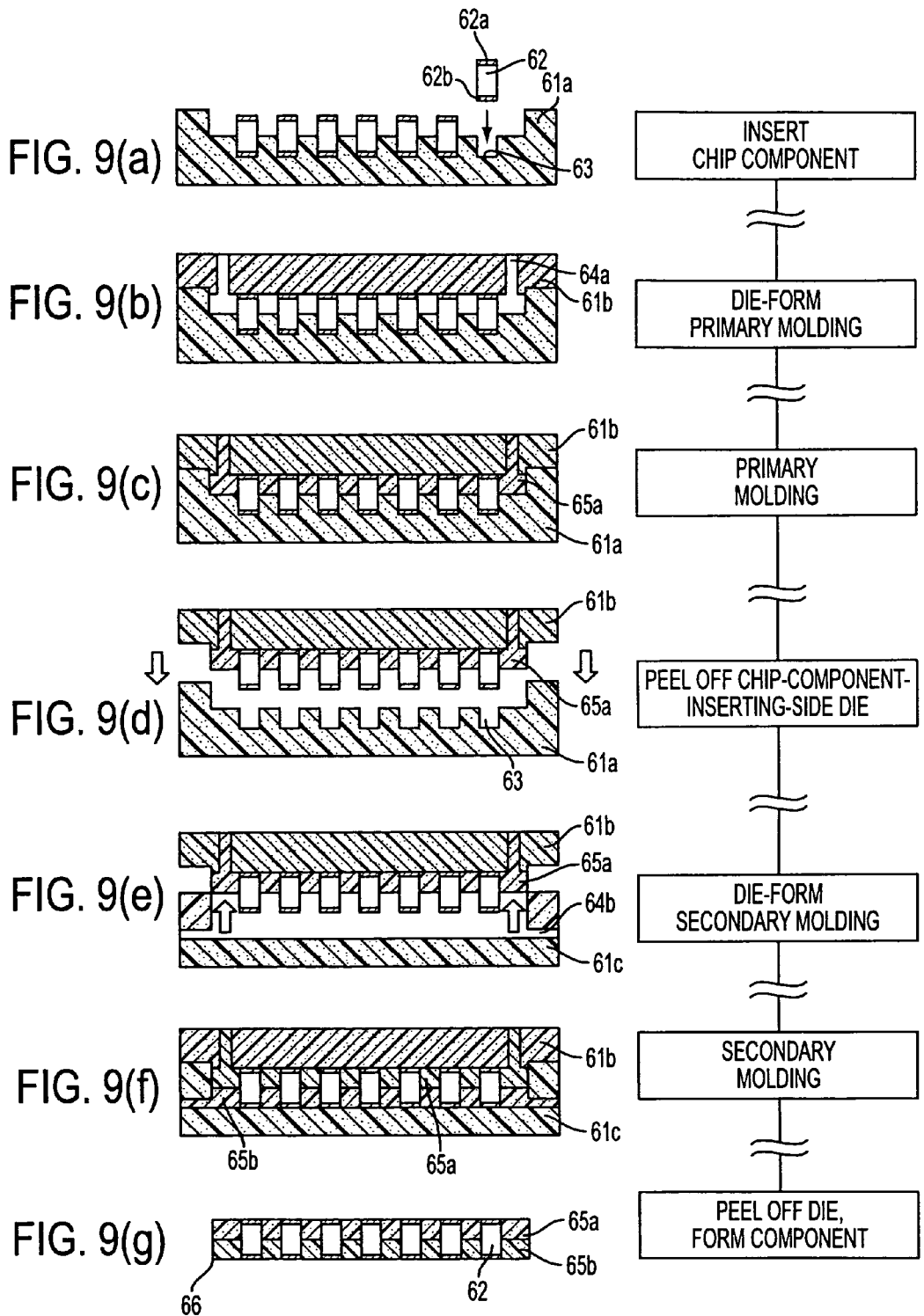
FIG. 9 is a sectional view showing a molding method of a chip component in embodiment 4 of the invention.

Referring to FIG. 9, a molding method of chip components in the embodiment will be explained. In the diagram, reference numeral 61*a* denotes a first die, on which recesses 63 are formed for positioning and holding chip components 62 according to a matrix, and first chip components 62 are inserted and arranged in the recesses (a: chip component inserting step). In this case, by forming recesses 63 in first die 61*a* in such a taper shape as conical or Y-form shape (not shown), the opening area of the chip component-inserting-side becomes wider, a machine can insert the chip components more easily, chip components 62 can be positioned automatically in recesses 63, and the gap of recesses 63 and chip components 62 can be filled up with resin smoothly. And outstanding merit is thus obtained.

Figure 10:
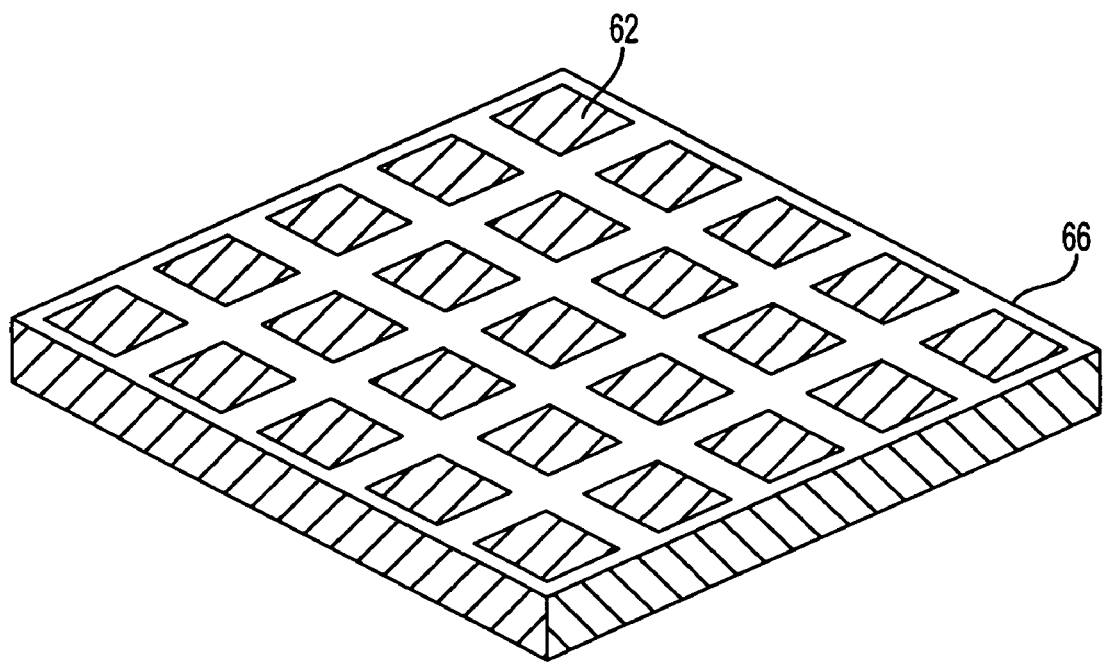
FIG. 10 is a perspective view showing a structure of molded component formed by the molding method.

After completely inserting the chip components 62, in order to expose end electrodes 62*a* of chip components 62 after forming, second die 61*b* is moved into first die 61*a* (b: primary molding-die-forming step). Resin 65*a* is then put through filling ports 64*a*, and a primary molding is performed (c: primary molding step). After the resin solidified, first die 61*a* at inserting-side of chip component 62 is peeled off (d: chip-inserting-side-die peeling step). And third die 61*c* is then moved so as to expose another end electrode 62*b* of chip component 62 (e: secondary molding-die-forming step). Resin 65*b* is put through filling ports 64*b*, and secondary molding is performed (f: secondary molding step). Molded component 66 shown in FIG. 10 is obtained after peeling off second and third dies 61*b*, 61*c* and shaping the component (g: die-peeling, shaping step).

For molding, by employing resin mainly composed of thermosetting resin material such as epoxy resin or phenol resin, and by processing at low temperature as possible, an influence of a heat treatment on chip components decreases. And without employing special chip components having an excellent heat resistance, the chip components work in the specified resistance value and capacity, so that the circuit characteristics, functions, and dimensional precision may be obtained exactly as designed.

By containing a filler having an excellent heat conductivity and heat resistance in the resin, the module component having an excellent heat release and heat resistance is realized. And more specifically, the heat-release can be improved by containing at least one of $Al_2O_3$, SiC, $Al_3N_4$, and $Si_3N_4$ as the filler in the resin. And the heat resistance is enhanced by containing ceramic powder and/or $SiO_2$ as the filler in the resin. Moreover, by containing magnetic material such as ferrite in the resin, a module component resistant to an influence of noise may be realized.

Embodiment 5

Figure 11A:
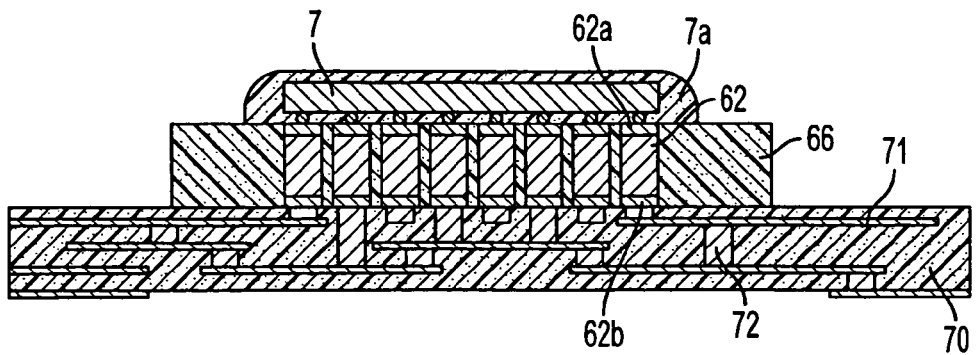
FIG. 11 is a sectional view showing an application example of module component employing a molded component in embodiment 5 of the invention.
Figure 11B:
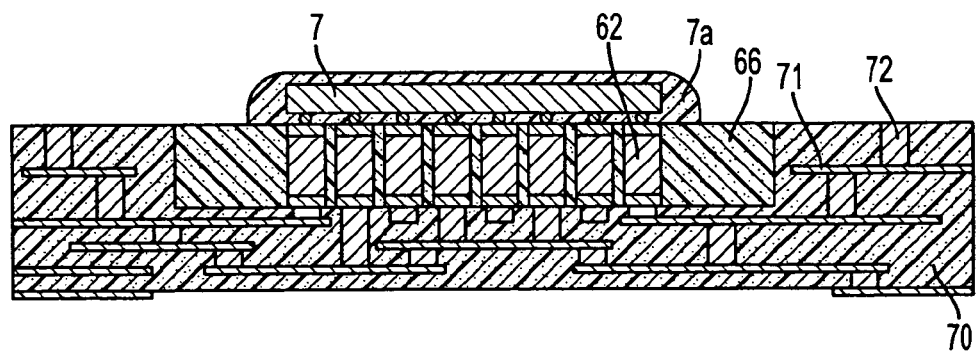
Figure 11C:
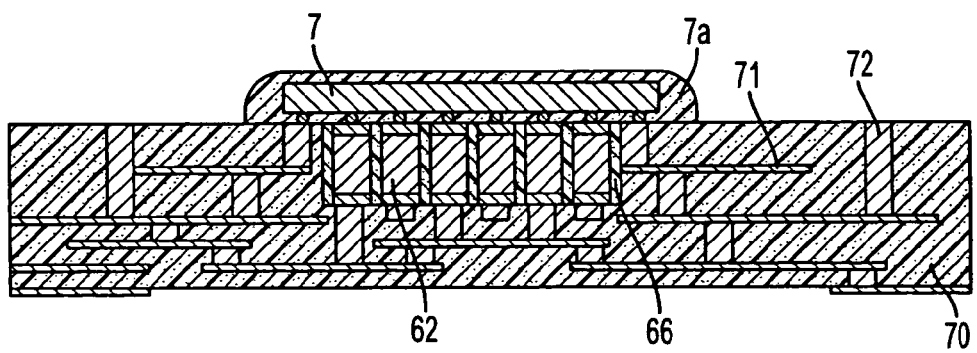
Figure 12A:
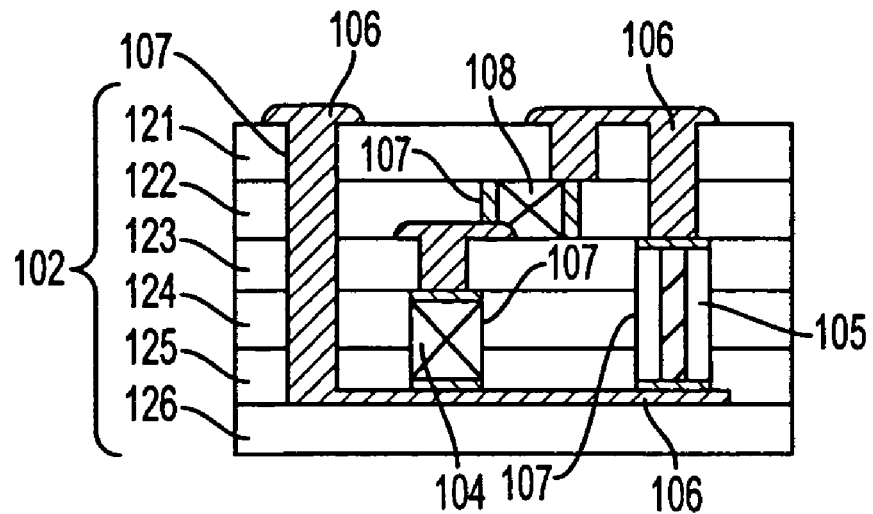
FIG. 12(a) is a sectional view showing a structure of multi-layer substrate embedding electronic components in a prior art.
Figure 12B:
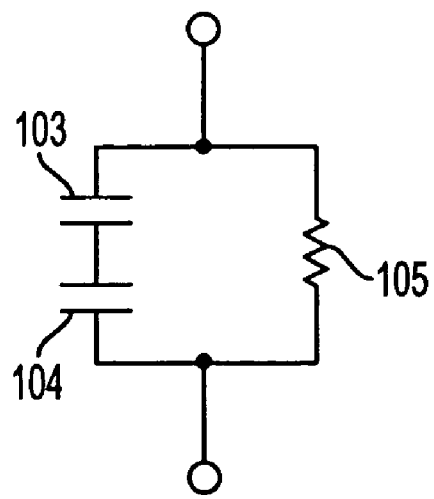
FIG. 12(b) is its equivalent circuit diagram.

FIG. 11 is a sectional view showing a schematic structure of a module component in embodiment 5 of the invention, representing an application example of module component using module component 66 shown in FIG. 10. FIG. 11(*a*) illustrates an example of mounting molded component 66 on multi-layer substrate 70. FIG. 11(*b*) illustrates an example of burying molded component 66 in multi-layer substrate 70. FIG. 11(*c*) illustrates an example of forming molded component 66 smaller than IC chip 7 and burying it in multi-layer substrate 70. Reference numerals 71, 72 denote wiring patterns and through-holes provided in multi-layer substrate 70, respectively. The same elements as in embodiment 4 are identified with the same reference numerals, and their explanation is omitted.

In any configuration in the diagram, since the terminals of IC chip 7 are directly coupled with wiring patterns 71 of multi-layer substrate 70 through chip components 62 in module component 66, component 66 is hardly influenced by a noise, which is induced from the conventional wiring from the IC chip.

Recently, a CPU is rapidly progressed at high speed, i.e., high frequency, and the driving frequency will jump into the GHz band in near future. As capacitors are usually used in the power source line of the CPU, and the speed is ultimately advanced, an influence of an equivalent series resistance (ESR) and an equivalent series inductance (ESL) occurring between the capacitor and the CPU cannot be ignored. And how to suppress it has been a key for a high-speed-operation of the CPU. By disposing chip capacitors around the IC chip (not shown), these values are suppressed. As the speed becomes higher, these values become noticeable even in such disposing.

Accordingly, as described in the embodiment, when chip capacitors of chip capacitors 62 function as bypass capacitors, the ESR and ESL can be suppressed very small Since the CPU and capacitors can be coupled directly, and it is thus applicable to higher speed in future. Moreover, when all or some of chip components 62 are designed to function as bypass capacitors, and when common electrodes are provided on both sides to cover and couple directly the end electrodes exposed therefrom with the CPU, it is applicable to a much higher speed operation.

In the diagram, when conductors having an excellent heat conductivity (e.g. copper, aluminum) are used in some of chip components 62, they can function as a bypass line, and IC chip 7 can thus be cooled more efficiently.

As clear from the description herein, according to embodiments 4 and 5, since the substrate is formed by molding the resin, it is not necessary to heat chip components at high temperature, and the chip components work in specified values. And the circuit characteristics, functions, and dimensional precision may thus be obtained exactly and stably as designed Since the chip components are disposed and molded with resin according to a specified rule, chip components to be inserted in the molding die automatically at a high speed are realized easily. The technique is flexibly applicable even if the size of the chip components is reduced, the circuit composition may be flexibly and easily changed only by changing an inserting position and a type of the chip components, and outstanding effect is obtained.

With the manufacturing method of embodiment 4, module components described in embodiments 2 and 3 can be formed, and the module components formed with the method of embodiment 1 can be used in application examples in embodiment 5, which is evident and is not particularly explained herein.

INDUSTRIAL APPLICABILITY

According to the invention, it is not required to heat the buried chip components at high temperature when forming module components, and the chip components work in specified values. And therefore, the circuit characteristics, functions, and dimensional precision may be obtained exactly and stably as designed. Since the chip components are disposed according to a specified rule, automatic and high speed insertion of chip components is easily realized. The technique is flexibly applicable even if the size of the chip components is reduced, and moreover, the circuit composition may be flexibly and easily changed only by changing the inserting position and type of the chip components.

The invention claimed is:

1. A method of manufacturing a module component comprising:
   an inserting step of inserting a chip component in a first molding die;
   placing a second molding die into the first molding die;
   a primary molding step of filling the area between the first molding die and the second molding die with a first resin such that a first end electrode of the chip component is exposed from the first resin;
   a first peeling step of peeling the first molding die from the chip component;
   placing a third molding die into the second molding die;
   a secondary molding step of filling the area between the second molding die and the third molding die with a second resin such that a second end electrode of the chip component is exposed from the second resin;
   a second peeling step of peeling the second molding die and the third molding die from the chip component to obtain a molded element; and
   a forming step of forming a circuit wiring on one side or both sides of the molded element molded with resin, wherein the chip component is disposed according to a specified rule.

2. A method according to claim 1, wherein the chip component is disposed in a specified position according to a matrix.

3. A method according to claim 2, wherein a dummy component having a same size as the chip component is inserted at a position where the chip component is not inserted according to the matrix.

4. A method of claim 2, wherein the matrix has N aligned rows and M aligned columns, N being equal to or greater than 3, and M being equal to or greater than 3.

* * * * *